US007388397B2

(12) United States Patent
Tomita

(10) Patent No.: US 7,388,397 B2
(45) **Date of Patent: *Jun. 17, 2008**

(54) TESTING METHOD FOR ARRAY SUBSTRATE

(75) Inventor: Satoru Tomita, Singapore (SG)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/626,530

(22) Filed: Jan. 24, 2007

(65) Prior Publication Data

US 2007/0115021 A1 May 24, 2007

Related U.S. Application Data

(62) Division of application No. 11/329,124, filed on Jan. 11, 2006, now Pat. No. 7,212,025, which is a division of application No. 10/212,273, filed on Aug. 6, 2002, now Pat. No. 7,023,234.

(30) Foreign Application Priority Data

Aug. 7, 2001 (JP) ............................ 2001-239645

(51) Int. Cl.
*G01R 31/00* (2006.01)

(52) U.S. Cl. ...................................................... 324/770

(58) Field of Classification Search ................. 324/770
See application file for complete search history.

(56) References Cited

U.S. PATENT DOCUMENTS

| | | | |
|---|---|---|---|
| 5,576,730 | A | 11/1996 | Shimada et al. |
| 6,525,556 | B2 | 2/2003 | Matsueda |
| 6,630,840 | B2 | 10/2003 | Tomita |
| 6,891,532 | B2 | 5/2005 | Nara et al. |
| 7,106,089 | B2 | 9/2006 | Nakano et al. |
| 2005/0093567 | A1 | 5/2005 | Nara et al. |

*Primary Examiner*—Ha Tran Nguyen
*Assistant Examiner*—Roberto Velez
(74) *Attorney, Agent, or Firm*—Oblon, Spivak, McClelland, Maier & Neustadt, P.C.

(57) ABSTRACT

A testing method for an array substrate is disclosed which includes a first measuring step of operating a line electrode driver circuit 15 and a row electrode driver circuit 16 like in a normal display mode while implementing writing in/reading out of a test video signal to and from supplemental capacitors 13, and a second measuring step of implementing writing in/reading out of the test video signals to and from a video bus 163 while rendering TFTs 11 of a pixel section 18 and analog switches 162 of the row electrode driver circuit 16 to be held turned off. Obtaining a difference between a measured result of the first measuring step and a measured result of the second measuring step allows only a pixel component and a row electrode component with no driver component to be derived, whereupon discrimination is implemented for the presence of or the absence of electric defects in the pixel section.

3 Claims, 3 Drawing Sheets

TESTING METHOD FOR ARRAY SUBSTRATE

CROSS-REFERENCE TO RELATED APPLICATIONS

The present application is a Divisional of U.S. application Ser. No. 11/329,124 filed on Jan. 11, 2006, which is a Divisional of U.S. application Ser. No. 10/212,273, filed on Aug. 6, 2002, now U.S. Pat. No. 7,023,234 and in turn claims priority to JP 2001-239645 filed on Aug. 7, 2001, the entire contents of each of which are hereby incorporated herein by reference.

BACKGROUND OF THE INVENTION

The present invention relates to a testing method for an array substrate for use in an active matrix type liquid crystal display device.

In general, since liquid crystal display devices are light in weight, thin and of low power consumption, they have been widely used as display elements of televisions, portable type information terminals or graphic displays, etc. Especially, since an active matrix type liquid crystal display device (hereinafter referred to as TFT-LCD) employing thin film transistors (hereinafter referred to as TFTs) as pixel switching elements is excellent in high speed response and suited for a high resolution capability, such a structure is focused to be a promising display device for realizing a high quality image, a large display size and a full color image of a display screen.

FIG. 1 is a circuit structural view of an array substrate for use in a general TFT-LCD of a related art. The array substrate 10 is formed with scanning line electrodes $G_1$, $G_2$, . . . $G_m$ (hereinafter generally referred to as G) and video signal row electrodes $D_1$, $D_2$, . . . $D_n$ (hereinafter generally referred to as D) which are wired in a matrix form, with TFTs 11 being formed as pixel switching elements at respective intersecting points between these line electrodes G and row electrodes D. The TFTs 11 have gates commonly connected to the line electrodes G for each line and sources commonly connected to the row electrodes D for each row. Further, drains of the TFTs 11 are connected to pixel electrodes 12 and also connected to supplemental capacitors 13 to which the respective pixel electrodes 12 are electrically connected. The respective supplemental capacitors 13 are commonly connected to a supplemental capacitor electrode 14 and applied with a given voltage potential.

In a subsequent description, a unit of display to be defined in a scale of the pixel electrode 12 is referred to as a pixel element, with a region in which a plurality of pixel elements are located being referred to as a pixel section.

Although not shown in FIG. 1 since FIG. 1 shows an electrode structure of an array substrate prior to assembling the same into a liquid crystal panel, a counter substrate, which is not shown, placed on the array substrate with a given distance in opposed relationship is formed at its entire surface with counter electrodes, with a liquid crystal layer being sandwiched between both the substrates.

In FIG. 1, further, ends of the line electrodes $G_1$, $G_2$, . . . $G_m$ are connected to a line electrode driver circuit 15, and ends of the row electrodes $D_1$, $D_2$, . . . $D_n$ are connected to a row electrode driver circuit 16. The line electrode driver circuit 15, the row electrode driver circuit 16 and the supplemental capacitor electrodes 14 are supplied with various timing signals, image signals and a power supply voltage from an external drive circuit substrate via input and output terminal groups (hereinafter referred to as probing pads) 17.

Control of the TFTs 11 which serve as the pixel switching elements during a normal display mode is carried out in a manner described below. In a liquid crystal panel structured using the above described array substrate, when line election signals are applied to the line electrodes $G_1$, $G_2$, . . . $G_m$ from the line electrode driver circuit 15 in a sequence starting from an upper electrode toward a lower electrode in synchronism with a horizontal scanning cycle, the TFTs 11 are turned on at timings in which the line selection signals are applied to the line electrodes G When video signals are applied to the row electrodes $D_1$, $D_2$, . . . $D_n$ from the row electrode driver circuit 16 in synchronism with the line selection signals, the video signals applied to the row electrodes D are written in the pixel electrodes 12 via the TFTs 11. As a result, the liquid crystal layer (not shown) sandwiched between both the substrates comes to be applied with a voltage depending on a difference between a signal voltage of the video signal written in the pixel electrode 12 and a counter voltage applied to the counter electrode (not shown), permitting the liquid crystal layer to optically respond in dependence on the magnitude of such a voltage to provide a display.

The above structure shows an example in which respective driver circuits of the line electrodes and the row electrodes are incorporated on the array substrate (glass substrate) and is called as p-Si (polycrystal silicone) TFT-LCD because of semiconductor material used for transistors. In contrast, a structure that uses a-Si (amorphous silicone) as semiconductor material is referred to as an a-SiTFT-LCD.

FIG. 2 is a circuit structural view of an array substrate for use in a general a-SiTFT-LCD of a related art, with like parts bearing the same reference numerals as those of FIG. 1. Since a-Si is inferior to p-Si in a transistor characteristic and, hence, the TFTs can not be minimized in size, it is difficult to incorporate the driver circuits on the array substrate. Accordingly, an array substrate 20 of a-SiTFT-LCD is structured with only a pixel section, with driver circuits being formed as driver ICs on an external drive circuit substrate that is not shown. Electrical connection between the driver circuits and the array substrate 20 are established using a technology such as TAB (Tape Automated Bonding) with probing pads 18, 19 formed on the array substrate 20.

In the meantime, in a later stage when a manufacturing step of the array substrate has been terminated, it is a usual practice to conduct an array test in order to confirm whether the manufactured array substrate properly functions. Such an array test has its own objectives such as: (a) preventing a defective array from being delivered to a cell step (subsequent step); (b) conducting a feed back to provide an improved process in the array step; and (c) providing an improved yield rate through an interlocking operation with a repair device. With the p-Si array substrate set forth above, a test is conducted for the pixel section and the driver circuits contained in the substrate, whereas with the a-Si substrate, only the pixel section is subjected to test. In this connection, typical testing processes for the pixel section are categorized in the following two technologies (1) an integrator process: of charging the supplemental capacitors (hereinafter suitably referred to as $C_s$ capacitors), discharging the capacitors after an elapse of a fixed time interva, implementing integration of current flowing at that time instant for conversion into the amount of charge stored in the $C_s$ capacitor, and measuring the amount of charge for thereby discriminating a quality of the pixel elements.

(2) a voltage detection process: of charging $C_s$ capacitors forming pixel element capacitors during a test mode, discharging the capacitors after an elapse of a fixed time interval, and measuring a voltage potential difference occurring at the time instant for thereby discriminating a quality of the pixel elements.

BRIEF SUMMARY OF THE INVENTION

Although the testing processes set forth above can be, in principle, applied to the p-Si or a-Si substrates, in actual practice, a testing precision with the p-Si substrate is apt to be lower than that of the a-Si substrate. This is due to the fact that with the p-Si substrate, since the testing is conducted by means of the driver circuits internally contained in the substrate, the testing result contains a driver component such as variations in characteristic of the analog switches and the video bus of the driver circuit when reading out the amounts of electrical charges of the $C_s$ capacitors which have been charged and voltage potential differences caused by discharging the $C_s$ capacitors.

Originally, a difficulty is encountered in reading out minimal currents, caused during discharging of the $C_s$ capacitors, with only in a range of approximately 1 pF and, in addition thereto, the presence of the superposition of the driver component contained in the read out signal results in a degradation in the test precision. Consequently, it is difficult for the related art testing methods to satisfactorily achieve the three objectives of the array testing for the p-Si array substrate.

It is therefore an object of the present invention to provide a testing method for an array substrate which enables a driver component or the like contained in a read out signal to be removed for improving a test precision to satisfactorily achieve objectives of an array test.

To achieve the above object, according to a first aspect of the present invention, there is provided a testing method for an array substrate including a pixel section having a plurality of row electrodes and a plurality of line electrodes which mutually intersect one another, a plurality of pixel electrodes disposed at respective intersecting points between both of these electrodes, a plurality of supplemental capacitors electrically connected to the respective pixel electrodes, and a plurality of pixel switching elements adapted to allow a line selection signal supplied to the line electrodes to provide conductance between the row electrodes and the pixel electrodes for thereby permitting a video signal supplied to the row electrodes to be written in the supplemental capacitors, a line electrode driver circuit which supplies the line selection signal to the line electrodes, and a row electrode driver circuit having a video bus adapted to supply the video signal, and a plurality of analog switches operative to provide conductance between the video bus and the row electrodes to allow the video signal supplied to the video bus to be supplied to the row electrodes, the testing method comprising a first measuring step of controlling the pixel switching elements and the analog switches into conductive states in a normal display mode, writing the test video signal supplied to the video bus in the supplemental capacitors from the row electrodes via the pixel switching elements, and reading out the test video signal from the supplemental capacitors after a lapse of a fixed time interval, a second measuring step of controlling the pixel switching elements and the analog switches into non-conductive states, and applying the test video signal to the video bus and reading out the video signal from the video bus after a lapse of a fixed time interval, wherein electric defects of the pixel section and the row electrodes are detected from a difference between a measured result of the first measuring step and a measured result of the second measuring step.

According to a second aspect of the present invention, there is provided a testing method for an array substrate with the same structure as that of the first aspect of the present invention, the testing method comprising a first measuring step of controlling the pixel switching elements and the analog switches into conductive states in a normal display mode, writing the test video signal supplied to the video bus in the supplemental capacitors from the row electrodes via the pixel switching elements, and reading out the test video signal from the supplemental capacitors after a lapse of a fixed time interval, a second measuring step of controlling the pixel switching elements into non-conductive states while controlling the analog switches into conductive states in the normal display mode, and applying the test video signal supplied to the video bus to the row electrodes and reading out the test video signal from the row electrodes via the video bus after a lapse of a fixed time interval, wherein electric defects of the pixel section are detected from a difference between a measured result of the first measuring step and a measured result of the second measuring step.

According to a third aspect of the present invention, there is provided a testing method for an array substrate with the same structure as that of the first aspect of the present invention, the testing method comprising a first measuring step of controlling the pixel switching elements into non-conductive states while controlling the analog switches into conductive states in a normal display mode, supplying the test video signal supplied to the video bus to the row electrodes, and reading out the test video signal from the row electrodes via the video bus after a lapse of a fixed time interval, a second measuring step of controlling the pixel switching elements and the analog switches into non-conductive states, and applying the test video signal to the video bus and reading out the test video signal from the video bus after a lapse of a fixed time interval, wherein electric defects of the row electrodes are detected from a difference between a measured result of the first measuring step and a measured result of the second measuring step.

According to a fourth aspect of the present invention, there is provided a testing method for an array substrate including a pixel section having a plurality of mutually intersecting row electrodes and a plurality of line electrodes which mutually intersect one another, a plurality of pixel electrodes disposed at respective intersecting points between both of these electrodes, a plurality of supplemental capacitors electrically connected to the respective pixel electrodes, and a plurality of pixel switching elements adapted to allow a line selection signal supplied to the line electrodes to provide conductance between the row electrodes and the pixel electrodes for thereby permitting a video signal supplied to the row electrodes to be written in the supplemental capacitors, the testing method comprising a first measuring step of controlling the pixel switching elements into conductive states in a normal display mode, writing the test video signal supplied to the row electrode to the supplemental capacitors via the pixel switching elements, and reading out the test video signal from the supplemental capacitors after a lapse of a fixed time interval, a second measuring step of controlling the pixel switching elements into non-conductive states, applying the test video signal to the row electrodes and reading out the test video signal from the row electrodes after a lapse of a fixed time interval, wherein electric defects of the pixel section are detected from a difference between a measured result of the first measuring step and a measured result of the second measuring step.

According to a fifth aspect of the present invention, there is provided a testing method for an array substrate with the same structure as that of the fourth aspect of the present invention, the testing method comprising a measuring step of controlling the pixel switching elements into non-conductive states, applying the test video signal to the row electrodes, and reading out the test video signal from the row electrodes after a lapse of a fixed time interval, wherein electric defects of the row electrodes are detected from a measured result of the measuring step.

DETAILED DESCRIPTION OF THE INVENTION

A method for testing an array substrate according to an aspect of the present invention is described hereinafter in detail with reference to an embodiment that is applied to an array substrate of a TFT-LCD.

Figure 1:
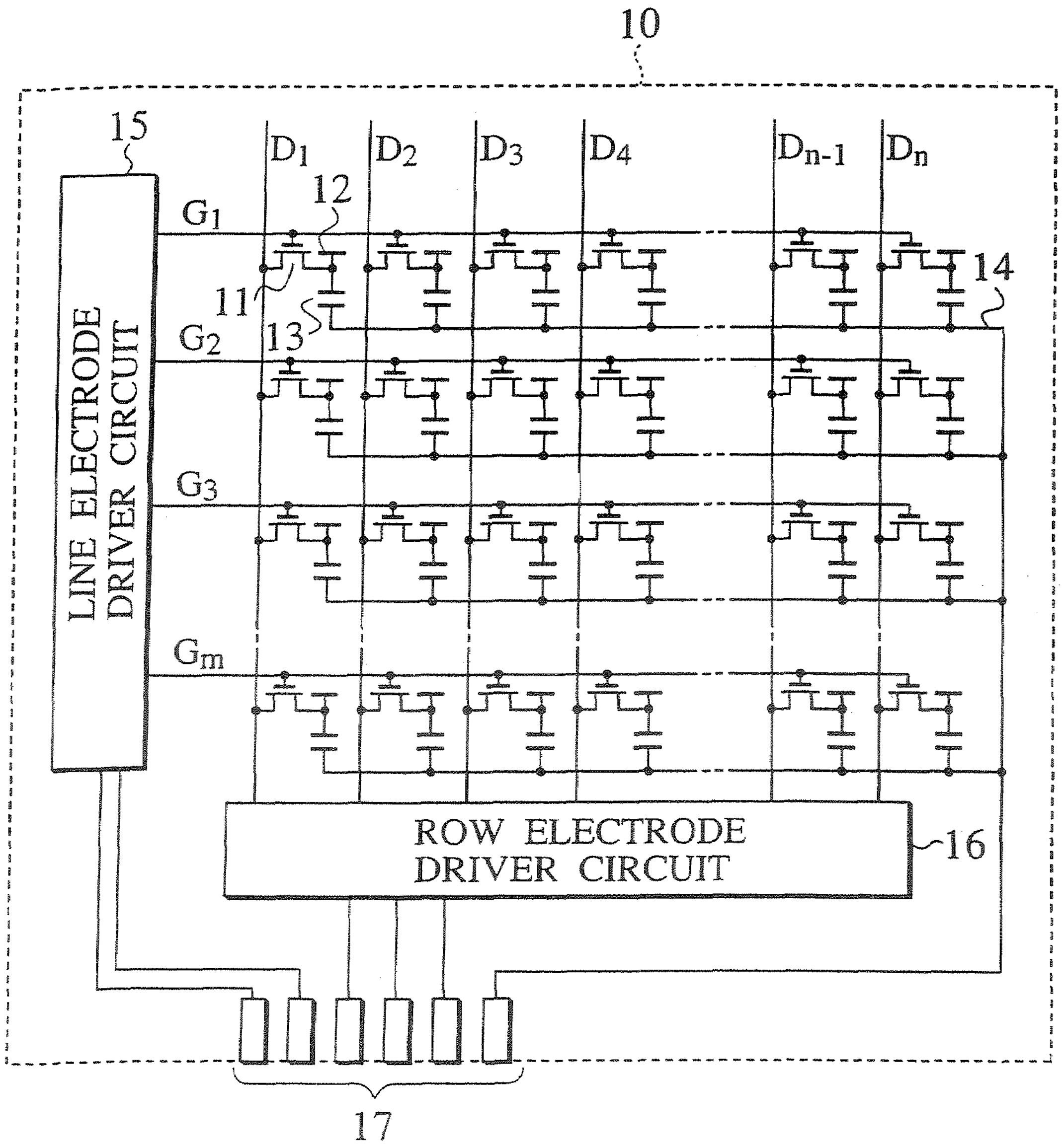
FIG. 1 BACKGROUND ART
FIG. 1 is a circuit structural view of an array substrate for use in a general TFT-LCD of a related art.
Figure 3:
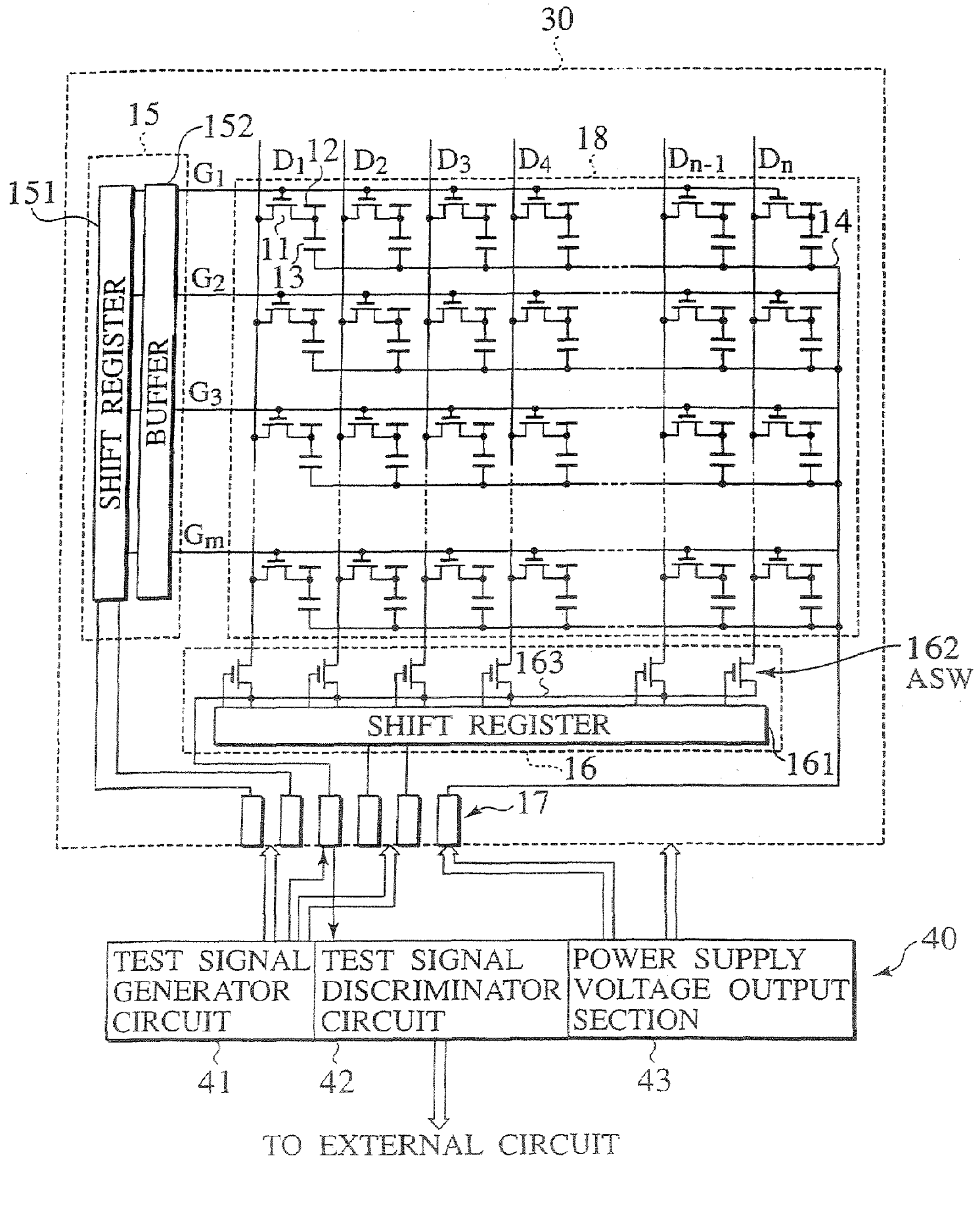
FIG. 3 is a circuit structural view of an array substrate according to an embodiment.

FIG. 3 is a circuit structural diagram of an array substrate 30 of the embodiment according to the present invention, with like parts bearing the same reference numerals as those used in FIG. 1. The array substrate 30 shown in FIG. 3 includes a p-si array substrate which is formed with a line electrode driver circuit 15, a row electrode driver circuit 16, probing pads 17 and a pixel section 18.

The pixel section 18 has the same structure in circuitry with that of FIG. 1 and, hence, a detailed description of the same is herein omitted, with structures of the line electrode driver circuit 15 and row electrode driver circuit 16 being simply described.

The line electrode driver circuit 15 is structured with a shift register 151 and a buffer 152 or the like. The shift register 151 outputs line selection signals to line electrodes $G_1$, $G_2$, . . . $G_m$ in response to vertical start signals and vertical clock signals supplied from a test signal generator 41, which will be described below, turning on the TFTs 11 that form the pixel switching elements. Test video signals supplied from the row electrode driver circuit 16 are written in the supplemental capacitors 13 via the TFTs 11 that are held turned-on. Since the TFTs 11 are turned on or turned off within a short time interval, the buffer 152 serving as a current amplifier is connected between the shift register 151 and the line electrodes G.

The row electrode driver circuit 16 is structured with a shift register 161, analog switches (ASW) 162, and a video bus 163. The shift register 161 outputs row selection signals to the analog switches 162 in response to the horizontal start signals and horizontal clock signals supplied from the testing signal generator 41 which is described below. Upon receipt of the row selection signals, only the analog switch 162, which is connected to the row electrode D to which the test video signal is to be supplied, is turned on and the other remaining analog switches are held turned OFF. And, the analog switch 162, when turned on, provides electrical conductance between the video bus 163 and the row electrode D, permitting the test video signal supplied to the video bus 163 to be delivered to the row electrode D.

Also, after the array substrate has been assembled into a liquid crystal panel, the line electrode driver circuit 15 and row electrode driver circuit 16 are supplied with the vertical/horizontal start signals and clock signals from external driver circuits which are not shown. Likewise, the video bus 163 is supplied with analog video signals via an external driver circuit that is not shown.

An array tester 40 is a supplementary circuit, prepared for testing local electric defects at respective parts of the array substrate 30, which is structured with the test signal generator section 41, a testing signal discriminating section 42 and a power supply voltage output section 43.

The test signal generator section 41 serves to produce testing video signals that are supplied to the video bus 163 while supplying the vertical/horizontal start signals and clock signals to the line electrode driver circuit 15 and the row electrode driver circuit 16, respectively.

The test signal discriminator section 42 reads out the testing video signals, that have been written in the supplemental capacitors 13 and row electrodes D, and functions to measure electric variables in accordance with the above described testing methods (1) or (2) (hereinafter referred to as a given testing method). Also, although the above described given testing method is conducted by nature to achieve charging to the supplemental capacitors, when using such a given testing method as part of the testing method of the embodiment of the present invention, the given testing method includes writing in/reading out the test video signals with respect to not only the supplementary capacitors 13 but also the row electrodes D and the video bus 163.

And, measurements comprised of writing in and reading out the test video signals are implemented two times, providing a difference between first time and second time measuring results from which the presence of electric defects of the pixel section 18 and the row electrodes D is discriminated. Each of the measuring results previously is stored in a memory that is not shown and, similarly, a discriminating result is output to an external circuit which is not shown.

Also, the first time measurement and second time measurement correspond to a first measuring step and a second measuring step, respectively, of the presently filed embodiment.

The power supply voltage output section 43 serves not only to provide the line electrode driver circuit 15 and the row electrode driver circuit 16 with a power supply voltage necessary for driving these components but also to supply a supplemental capacitor voltage to the supplemental capacitor line electrodes 14. Further, the power supply voltage output section 43 serves to supply the power supply voltage to the test signal generator section 41 and the test signal discriminator section 42.

Delivery of signals between the array tester 40 and the array substrate 30 is conducted by means of probing pads 17.

Now, the testing method for the array substrate 30 which are structured in a manner set forth above is described below with reference to Embodiments 1, 2 and 3.

In a subsequent description, also, an expression of "ON/OFF control like in a normal display mode" referred to "ON/OFF control responsive to the horizontal/vertical start signals and the clock signals" as set forth above in the previous description of the above described pixel switching elements and analog switches.

Embodiment 1

In Embodiment 1, during the first time measurement, the line electrode driver circuit 15 and the row electrode driver circuit 16 are controlled in the turned ON/OFF states like in a normal display mode, thereby permitting the test video signals to be written in the supplemental capacitors 13. And, after an elapse of a certain time interval (for instance, a time interval corresponding to one frame period), the line electrode driver circuit 15 and the row electrode driver circuit 16 are controlled again in the turned ON/OFF states like in the normal display mode, thereby permitting the test video signal discriminator section 42 to read out the testing video signals written in the supplemental capacitors 13. Then, the test video signal discriminator section 42 measures the read out signals in accordance with the given testing method.

Next, during the second time measurement, all of the TFTs 11 of the pixel section 18 and all of the analog switches 162 of the row electrode driver circuit 16 are held turned OFF, permitting the test video signals to be written in the video bus 163. And, after an elapse of a certain time interval like during the first time measurement, the test signal discriminator section 42 reads out the test video signals written in the video bus 163. The test signal discriminator section 42 measures the read out signals in accordance with the above described integrator process or voltage detection process.

During the second time measurement, further, by fixing the vertical start signal, to be supplied to the shift register 151 of the line electrode driver circuit 15 from the test signal generator section 41, at a low logic level or high logic level, it is possible for all of the TFTs 11 of the pixel section 18 to be brought into the turned-off state. Also, fixing the horizontal start signal, to be supplied to the shift register 161 from the test signal generator section 41, at the low logic level or high logic level enables all of the analog switches 162 of the row electrode driver circuit 16 to be brought into the turned OFF state.

The test signal discriminator section 42 serves to discriminate the presence of or the absence of the electrical defects of the respective pixel elements in the pixel section 18 and the row electrodes D from a differential component between the first time measuring result and the second time measuring result that are set forth above. That is, since the first time measurement is implemented via the row electrode driver circuit 16, the measuring result is apt to contain the driver component as previously described. However, by conducting the measurement under a condition in which the TFTs 11 of the pixel section 18 and the analog switches 162 of the row electrode driver circuit 16 are held turned-off during the second time measurement, it is possible to obtain a measuring result containing only the driver component with no pixel component and no row electrode component. Accordingly, by determining the difference between the first time measuring result, containing the row electrode component and the driver component, and the second time measuring result containing only the driver component, only the pixel component and the row electrode component can be derived. That is, this relation is given by (Pixel Component+Row Electrode Component+Driver Component)−(Driver Component)=Pixel Component+Row Electrode Component ①

Here, the first term of the left side of the above relation ① represents the first time measuring result and the second term of the left side expresses the second time measuring result. On the basis of the product of the pixel component+the row electrode component thus obtained, discrimination is made for the presence of or the absence of the electrical defects such as point defects or line defects contained in the pixel section 18. That is, there are electrostatic capacitances (pixel capacitances and row electrode capacitances or the like), in circuit lines to which the signals are written in, that are different from another between normal areas with no defects and the other areas with point defects and line defects. Since such discrimination is implemented based on the measuring results with no driver component, the array testing can be performed at a higher testing precision than that obtained in the related art practice. Also, the driver component in this Embodiment contains characteristic variations of the video bus 163 and parasitic capacitances formed between the analog switches 162 and associated peripheral wirings.

In the above described Embodiment 1, since the removal of the driver component from the measuring result provides a capability of precisely detecting the point defects and line defects or the like, the object of the array testing set forth above can be achieved in a satisfactory manner.

Embodiment 2

In Embodiment 2, during the first time measurement, the line electrode driver circuit 15 and the row electrode driver circuit 16 are controlled in the turned ON/OFF states like in the normal display mode, thereby permitting the testing video signals to be written in the supplemental capacitors 13. And, at a moment after an elapse of a certain time interval (for instance, a time interval corresponding to one frame period), the line electrode driver circuit 15 and the row electrode driver circuit 16 are controlled again in the turned ON/OFF states like in the normal display mode, thereby permitting the test video signal discriminator section 42 to read out the test video signals written in the supplemental capacitors 13. The test video signal discriminator section 42 measures the read out signals in accordance with the given testing process.

Next, during the second time measurement, all of the TFTs 11 of the pixel section 18 are held turned OFF while controlling the analog switches 162 in the turned ON/OFF states like in the normal display mode, allowing the test video signals to be written in the row electrodes $D_1$, $D_2$, . . . $D_n$. And, at a moment after an elapse of a certain time interval like in the first time measurement, the test signal discriminator section 42 reads out the test video signals written in the respective row electrodes D. The test signal discriminator section 42 measures the read out signals in accordance with the given testing process.

Further, during the second time measurement, fixing the vertical start signal, to be supplied to the shift register 151 of the line electrode driver circuit 15 from the test signal generator section 41, to have a low logic level or a high logic level enables all of the TFTs 11 of the pixel section 18 to be rendered turned-off.

The test signal discriminator section 42 serves to discriminate the presence of or the absence of the electrical defects of the pixel section 18 and the row electrodes D from a difference between the first time measuring result and the second time measuring result that are set forth above. That is, since the first time measurement is implemented via the row electrode driver circuit 16, the measuring result unavoidably contains not only the pixel component and the row electrode component but also the driver component. However, by conducting the measurement under a condition in which the TFTs 11 of the pixel section 18 are held turned OFF during the second time measurement, it is possible to obtain a measuring result containing only the driver component and the row electrode component with no pixel component. Accordingly, by determining the difference between the first time measuring result, containing the pixel component, the row electrode component and the driver component, and the second time measuring result containing only the driver component, only the pixel component can be derived. That is, this relation is given by (Pixel Component+Row Electrode Component+Driver Component)−(Row Electrode Component+Driver Component)=Pixel Component ②

Here, the first term of the left side of the above relation ② represents the first time measuring result and the second term of the left side expresses the second time measuring result. On the basis of the pixel component, discrimination is conducted for the presence of or the absence of the electrical defects such as the point defects in the pixel section 18. Since such discrimination is made based on the measuring results with no row electrode component and no driver component, the array testing can be performed at the higher testing precision than that obtained in the conventional practice. Also, the driver component in this Example contains characteristic variations of the video bus 163 and parasitic capacitors formed between the analog switches 162 and associated peripheral wirings.

In Embodiment 2 set forth above, since the removal of the row electrode component and the driver component from the measuring result provides a capability of precisely detecting only the pixel component to enable detection of the point defects in a precise manner. Consequently, this technique is highly effective especially in a case where there are frequent occurrences of the point defects due to troubles caused in the process. And, in this Embodiment, the object of the array testing set forth above can be achieved in a satisfactory manner.

Embodiment 3

In Embodiment 3, during the first time measurement of this Example 3, all of the TFTs 11 of the pixel section 18 are held turned off, and the analog switches 162 are controlled in the turned ON/OFF states like in the normal display mode, allowing the test video signals to be written in the row electrodes $D_1, D_2, \ldots D_n$. And, at a moment after an elapse of a certain time interval (for instance, a time interval corresponding to one frame period), the analog switches 162 are controlled in the turned ON/OFF states like in the normal display mode with all of the TFTs 11 of the pixel section 18 remaining turned OFF, thereby permitting the test video signal discriminator section 42 to read out the test video signals written in the row electrodes D. The test video signal discriminator section 42 measures the read out signals in accordance with the given testing process.

Further, during the first time measurement, fixing the vertical start signal, to be supplied to the shift register 151 of the line electrode driver circuit 15 from the test signal generator section 41, at the low logic level or high logic level enables all of the TFTs 11 of the pixel section 18 to be brought into the turned-off state.

Next, during the second time measurement, all of the TFTs 11 of the pixel section 18 and all of the analog switches 162 of the row electrode driver circuit 16 are turned OFF, allowing the test video signals to be written in the video bus 163. And, at a moment after the elapse of the certain time interval like in the first time measurement, the test signal discriminator section 42 reads out the test video signals written in the video bus 163. The test signal discriminator section 42 measures the read out signals in accordance with the given testing process.

Further, during the second time measurement, fixing the vertical start signal, to be supplied to the shift register 151 of the line electrode driver circuit 15 from the test signal generator section 41, at the low logic level or high logic level enables all of the TFTs 11 of the pixel section 18 to be brought into the turned OFF state. Furthermore, fixing the horizontal start signal, to be supplied to the shift register 161 from the test signal generator section 41, at the low logic level or high logic level enables all of the analog switches 162 of the row electrode driver 16 to be brought into the turned OFF state.

The test signal discriminator section 42 serves to discriminate the presence of or the absence of the electrical defects of the row electrodes D from a difference between the first time measuring result and the second time measuring result that are set forth above. That is, since the first time measurement is implemented via the row electrode driver circuit 16, the measuring result unavoidably contains not only the row electrode component but also the driver component. However, by conducting the measurement while keeping the TFTs 11 of the pixel section 18 and the analog switches 162 of the row electrode driver circuit 16 turned OFF during the second time measurement, it is possible to obtain a measuring result containing only the driver component with no pixel component and no row electrode component. Accordingly, by determining the difference between the first time measuring result, containing the row electrode component and the driver component, and the second time measuring result containing only the driver component, only the row electrode component can be derived. That is, this relation is given by (Row Electrode Component−Driver Component)−(Driver Component)=Row Electrode Component ③

Here, the first term of the left side of the above relation ③ represents the first time measuring result and the second term of the left side expresses the second time measuring result. On the basis of the row electrode component, discrimination is made for the presence of or the absence of the electrical defects such as the line defects in the pixel section 18. Since such discrimination is made on the basis of the measuring results with no driver component, the array testing can be performed at the higher testing precision than that obtained in the conventional practice.

In Embodiment 3 set forth above, since the removal of the driver component from the measured result provides a capability of precisely detecting only the row electrode component to enable detection of the line defects in a precise manner. Consequently, this technique is highly effective especially in a case where there are frequent occurrences of the line defects due to troubles caused in the process. And, in this Embodiment, the object of the array testing set forth above can be achieved in a satisfactory manner.

Moreover, while, in Embodiments 1 to 3 set forth above, the shift register 161 has been shown and described as formed on the array substrate 30, the shift register may not necessarily have such a configuration. For instance, the present invention can be applied even to a structure in which outputs of TAB-IC are distributed in a plurality of row electrodes via the video bus line formed on the array substrate 30 by means of a selection circuit including the analog switches.

Embodiment 4

Figure 2:
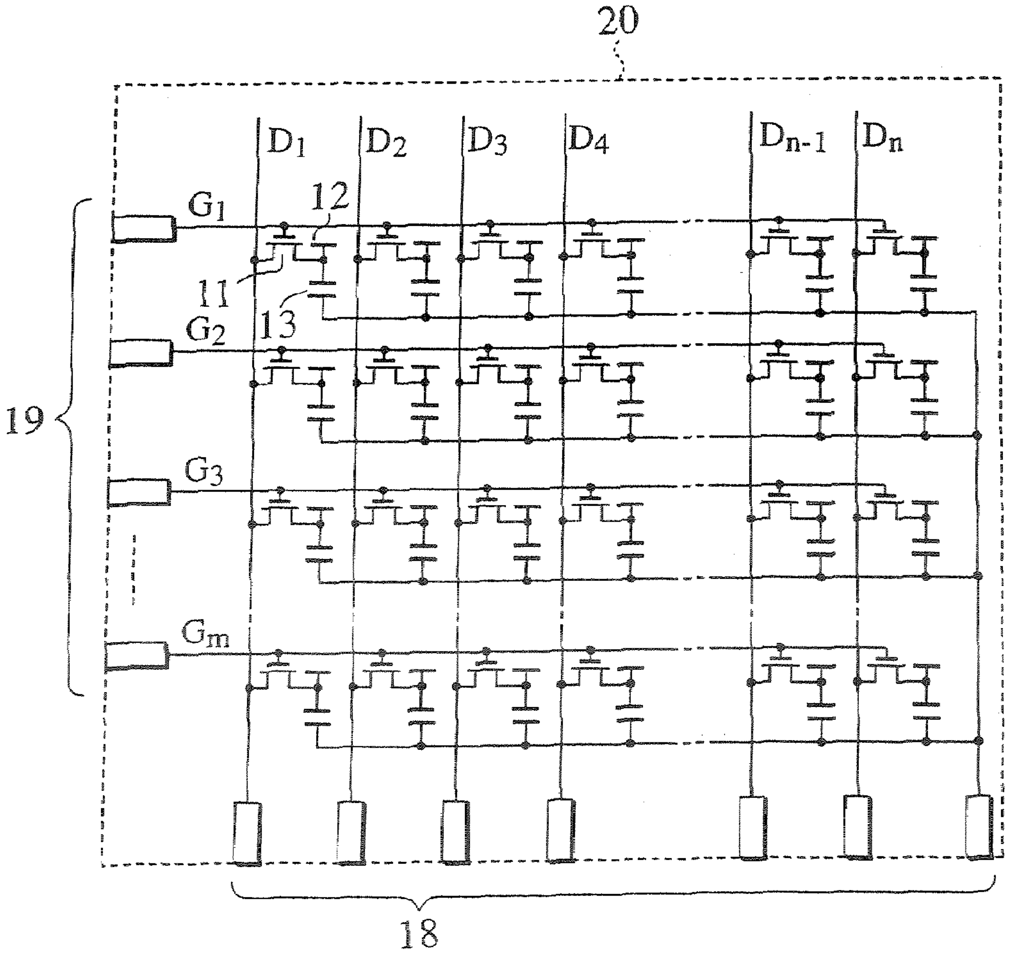
FIG.2 BACKGROUND ART
FIG. 2 is a circuit structural view of an array substrate for use in a general a-SiTFT-LCD of a related art.

While Embodiments 1 to 3 have been described with reference to the testing methods for the array substrate 30 with p-Si material, the method for testing the array substrate according to the embodiment of the present invention may be applied to an array substrate with a-Si. A method for testing the array substrate 20 with a-Si as shown in FIG. 2 is described hereinafter with reference to Embodiments 4 and 5.

In this Embodiment 4 (and subsequent Embodiment 5 which will be described below), although the testing is conducted using the array tester 40 shown in FIG. 3, the driver circuit is not contained in the array substrate 20 and, hence, the test signal generator section 41 applies the line selection signals to the line electrodes $G_1$, $G_2$, . . . $G_m$ via the probing pads 19. The line selection signals are applied to the line electrodes $G_1$, $G_2$, . . . $G_m$ at timings in synchronism with the horizontal scanning cycle in a sequence starting from an upper area to a lower area in the figure. Further, the test signal generator section 41 supplies the test video signals to the row electrodes $D_1$, $D_2$, . . . $D_n$ via the probing pads 18. The test video signals are supplied to the row electrodes $D_1$, $D_2$, . . . $D_n$ in a single direction in sequence or all these signals are concurrently supplied thereto.

In this Embodiment 4, during the first time measurement, applying the line selection signals to the line electrodes G at the same timings as those of the normal display mode while applying the test video signals to the row electrodes at the same timings as those of the normal display mode allows the test video signals to be written in the supplemental capacitors 13. And, at a moment after an elapse of a certain time interval (for instance, a time interval corresponding to one frame period), the line selection signals are applied again to the line electrodes G at the same timings as those of the normal display mode, thereby permitting the test signal discriminator section 42 to read out the test signal video signals written in the supplemental capacitors 13. The test signal discriminator section 42 measures the read out signals according to the given testing process.

Next, during the second time measurement, all of the TFTs 11 of the pixel section are held turned off, allowing the testing video signals to be written in the row electrodes $D_1$, $D_2$, . . . $D_n$. And, at a moment after the elapse of the certain time interval like in the first time measurement, the test signal discriminator section 42 reads out the testing video signals written in the respective row electrodes $D_1$, $D_2$, . . . $D_n$. The test signal discriminator section 42 measures the read out signals in accordance with the given testing method.

Further, during the second time measurement, precluding the line selection signals from being supplied to the line electrodes C from the test signal generator section 41 enables all the TFTs 11 of the pixel section to remain turned off.

The test signal discriminator section 42 serves to discriminate the presence of or the absence of the electrical defects of the pixel section from a difference between the first time measuring result and the second time measuring result that are set forth above. That is, since the first time measurement is implemented via the row electrodes D, the measuring result unavoidably contains not only the pixel component but also the row electrode component. However, by conducting the second time measurement while keeping the TFTs 11 of the pixel section turned OFF, it is possible to obtain a measuring result containing only the row electrode component with no pixel component. Accordingly, by determining the difference between the first time measuring result, containing pixel component and the row electrode component, and the second time measuring result containing only the row electrode component, only the pixel component can be derived. That is, this relation is given by $$\text{(Pixel Component+Row Electrode Component)}-\text{(Row Electrode Component)}=\text{Pixel Component} \quad ④$$

Here, the first term of the left side of the above relation ④ represents the first time measuring result and the second term of the left side expresses the second time measuring result. On the basis of the pixel component, discrimination is conducted for the presence of or the absence of the electrical defects such as the point defects in the pixel section. By nature, since the testing is not conducted for the a-Si array substrate via the driver circuit contained therein, the testing precision becomes higher than that of the p-Si array substrate. However, since discrimination in the presently filed Embodiment is conducted on the basis of the measuring result containing no row electrode component, it is possible to perform the array testing at a further higher precision that that of the conventional practice.

In Embodiment 4 set forth above, since the removal of the row electrode component from the measured result provides a capability of detecting only the pixel component, it is possible to precisely detect the point defects that form deficiencies of pixel elements per se. Consequently, this technique is highly effective especially in a case where there are frequent occurrences of the point defects due to troubles caused in the process. And, in this Embodiment, the object of the array testing set forth above can be achieved in a satisfactory manner.

Embodiment 5

In this Embodiment 5, all of the TFTs 11 of the pixel section are held turned OFF, allowing the test video signals to be written in the row electrodes $D_1$, $D_2$, . . . $D_n$. And, at a moment after the elapse of the certain time interval (for instance, a time interval corresponding to one frame period), the test signal discriminator section 42 reads out the test video signals written in the respective row electrodes D. The test signal discriminator section 42 measures the read out signals in accordance with the given testing process. In Embodiment 5, thus, the measurement is carried out only one time.

In a case where all the TFTs 11 of the pixel section are held turned OFF as set forth above, a measuring result is obtained which contains only the row electrode component with no pixel component. Consequently, the test signal discriminator section 42 discriminates the presence of or the absence of the electric defects such as the line defects of the pixel section on the basis of the row electrode component obtained in the measurement set forth above.

In Embodiment 5 set forth above, since a measuring result containing only the row electrode component can be obtained, it is possible for the line defects to be precisely detected. Consequently, this technique is highly effective especially in a case where there are frequent occurrences of the line defects due to troubles caused in the process. And, in this Embodiment, the object of the array testing set forth above can be achieved in a satisfactory manner.

Further, in Embodiments 4 and 5 set forth above, the present invention is applicable even to a structure in which the line electrode driver circuit is formed on the array substrate 20 in the same manner as those of Embodiments 1 to 3.

As previously described above, according to the embodiment of the present invention, the driver component contained in the signals read out from the array substrate can be removed to improve the testing precision, the object of the array testing is enabled to be satisfactorily achieved.

The present disclosure relates to subject matter contained in Japanese Patent Application No. 2001-239645, filed on Aug. 7, 2001, the disclosure of which is expressly incorporated herein by reference in its entirety.

What is claimed is:

1. A testing method for an array substrate including a pixel section having a plurality of row electrodes and a plurality of line electrodes which mutually intersect one another, a plurality of pixel electrodes disposed at respective intersecting points between both of these electrodes, a plurality of supplemental capacitors electrically connected to the respective pixel electrodes, and a plurality of pixel switching elements adapted to allow a line selection signal supplied to the line electrodes to provide conductance between the row electrodes and the pixel electrodes for thereby permitting a video signal supplied to the row electrodes to be written in the supplemental capacitors, a line electrode driver circuit which supplies the line selection signal to the line electrodes, and a row electrode driver circuit having a video bus adapted to supply the video signal, and a plurality of analog switches operative to provide conductance between the video bus and the row electrodes to allow the video signal supplied to the video bus to be supplied to the row electrodes, the testing method comprising:

first controlling the pixel switching elements and the analog switches into conductive states in a normal display mode, writing a test video signal supplied to the video bus in the supplemental capacitors from the row electrodes via the pixel switching elements, and subsequently reading out the test video signal from the same circuit line;

second controlling the pixel switching elements and the analog switches into non-conductive states, and applying the test video signal to the video bus and subsequently reading out the video signal from the video bus; and detecting electric defects of the pixel section and the row electrodes from a differential component between the signal read out in the first controlling and the signal read out in the second controlling.

2. The testing method for an array substrate according to claim 1, wherein after writing the test video signal in the first controlling, the test video signal is read out from the same circuit line after an elapse of one frame period.

3. The testing method for an array substrate according to claim 1, wherein after applying the test video signal in the second controlling, the test video signal is read out from the video bus after an elapse of one frame period.

* * * * *